US006913858B2

(12) United States Patent
Kim

(10) Patent No.: US 6,913,858 B2
(45) Date of Patent: Jul. 5, 2005

(54) PHOTOMASK FOR MEASURING LENS ABERRATION, METHOD OF MANUFACTURING THE SAME, AND METHOD OF MEASURING LENS ABERRATION

(75) Inventor: Ho-Chul Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 168 days.

(21) Appl. No.: 10/368,422

(22) Filed: Feb. 20, 2003

(65) Prior Publication Data

US 2003/0193656 A1 Oct. 16, 2003

(30) Foreign Application Priority Data

Apr. 15, 2002 (KR) ........................................ 2002-20469

(51) Int. Cl.[7] .............................. G01F 9/00; G03C 5/00
(52) U.S. Cl. ........................................... 430/5; 430/394
(58) Field of Search ............................... 430/5, 22, 30, 430/394; 716/19, 21; 356/124–127

(56) References Cited

U.S. PATENT DOCUMENTS 6,548,312 B1 * 4/2003 Hayano et al. ................ 438/5
6,743,554 B2 * 6/2004 Nakao ............................ 430/5

* cited by examiner

*Primary Examiner*—S. Rosasco
(74) *Attorney, Agent, or Firm*—Volentine Francos & Whitt, PLLC

(57) ABSTRACT

A photomask is useful in measuring the aberration of an optical lens. The photomask includes a transparent substrate, a first opaque pattern formed on a first surface of the transparent substrate and defining a plurality of apertures that expose the first surface, and a second opaque pattern formed on the second surface of the transparent substrate. The photomask is placed in an exposure apparatus between a light source of the exposure apparatus and an optical lens whose aberration is to be measured. A photoresist layer on a wafer is exposed through the photomask and the pupil of the optical lens to form a first pattern on the wafer corresponding to the second opaque pattern of the photomask. The aberration of the pupil of the optical lens is evaluated based on the relative location at which the first pattern is formed on the wafer. Because the optical aperture is formed on the photomask along with the pattern whose image is to be transferred to the photoresist layer, the alignment between the optical aperture and the photomask pattern is assured.

41 Claims, 7 Drawing Sheets

PHOTOMASK FOR MEASURING LENS ABERRATION, METHOD OF MANUFACTURING THE SAME, AND METHOD OF MEASURING LENS ABERRATION

BACKGROUND OF THE INVENTION

1. Field of the Invention

The present invention relates to a photomask, to a method of manufacturing the same, and to a method of using the photomask to measure the aberration of an image produced by a lens. In particular, the present invention relates to a method of measuring the aberration produced by a lens of an exposure apparatus used in the manufacturing of semiconductor devices or the like.

2. Description of the Related Art

In fabricating semiconductor devices or liquid crystal displays (LCDs), an exposure apparatus irradiates a substrate with light directed through a photomask, bearing a predetermined pattern, to thereby form a desired pattern on the substrate. More specifically, the pattern defined by the photomask is formed on the substrate on the same scale or at a reduced scale in the case of a reduction projection exposure apparatus. To this end, the exposure apparatus also includes an optical system having a lens. However, due to limitations on the design and manufacturing of the lens, the lens of the optical system produces an aberration, i.e., errors in the image formed by the optical system on the substrate. For example, the projection lens of a reduction projection exposure apparatus can produce errors such as a spherical aberration, astigmatism, or coma aberration. In order to minimize the effects of the aberration produced by a lens of an optical system, it is important to precisely measure what will be hereinafter referred to as the aberration of the lens.

In general, any specific feature of the photomask image to be transferred to a substrate is transferred through the entire pupil of the lens during an exposure process. Accordingly, it is difficult to use such an exposure process to measure the lens characteristics of only a specific region on the plane of the pupil of the lens. In order to analyze the pupil of the lens, it is necessary to form an image by passing optical beams through specific locations on the pupil of the lens. In other words, information on the pupil of the lens can be attained by separating the plane of the pupil into small regions and creating an image by transferring light features through the small regions.

In a conventional method of measuring the aberration of a lens, an image is formed on a substrate by passing an optical beam through a photomask, and then through a specific region of the plane of the pupil of the lens via apertures disposed under the photomask as formed separately therefrom. The apertures are used for determining the aberration characteristics of a specific region of the pupil by limiting the angle at which the optical beam is incident on the lens. That is, the apertures cause the beam, which has passed through a transmissive portion of the photomask having a predetermined shape, for example, that of a bar, to pass through the lens at a specific angle.

However, the prior art apparatus for measuring the aberration of a lens is complex as it requires separate apertures installed on or under the photomask. In addition, the apertures have to be mechanically moved to precisely align the photomask and the apertures. The alignment process requires a large amount of time and compromises the precision of the results of measuring the aberration of the lens.

SUMMARY OF THE INVENTION

An object of the present invention is to solve the above-described problems of the prior art.

Accordingly, one object of the present invention is to provide a photomask that can be used in an exposure apparatus to precisely measure the aberration of a lens. Likewise, it is an object of the present invention to provide a method of manufacturing such a photomask.

Another object of the present invention is to provide a method of measuring the aberration of a lens using an exposure apparatus wherein an optical aperture(s) of the apparatus does not have to be aligned with the photomask used to transfer an image through the lens to a photoresist layer on a wafer.

According to the present invention, the photomask for use in measuring the aberration of a lens comprises a transparent substrate having a first surface and a second surface, a first opaque layer patterned on the first surface of the transparent substrate to define a plurality of apertures that expose the first surface, and a second opaque layer patterned on the second surface of the transparent substrate as aligned with the apertures.

The apertures of the first opaque pattern may be circular apertures having the same diameter. Preferably, the diameter of the apertures is 5 to 15 times larger than the line width of the second opaque pattern. In this respect, the second opaque pattern may be in the form of a grid. Thus, the first opaque pattern and the second opaque pattern are aligned such that a respective portion of the opaque material constituting the grid is aligned within a predetermined distance from the center a respective one of each of the apertures, the distance being smaller than the radius of the aperture.

The photomask may further include alignment marks formed on at least one of the first second surfaces of the transparent substrate. When the alignment marks are formed on the firs surface, the process of patterning the second opaque layer may be executed using the alignment marks to align the second opaque pattern with the apertures of the first opaque pattern.

The photomask may still further include a third opaque pattern formed on the second surface of the transparent substrate so as to have a different form, e.g. shape, than that of the second pattern. The third opaque pattern is used for forming a pattern on a wafer as a reference pattern. The reference pattern is used to measure the deviation of the pattern formed on the wafer by exposing the wafer using the second opaque pattern of the photomask. The third opaque pattern of the photomask is, for example, an array of rectangular portions of opaque material. In this case, the lengths of the sides of the rectangular portions of the third opaque pattern are smaller than the lengths of the corresponding sides of the rectangular openings defined by the grid constituting the second opaque pattern.

When the photomask includes the third opaque pattern, the patterning of the first opaque layer is used to form a transmissive region that exposes the first surface of the substrate and is free of the first opaque pattern.

The photomask is positioned in the exposure apparatus with the first surface of its transparent substrate facing the light source of the exposure apparatus and the second surface of its substrate facing the optical lens whose aberration is to be measured, as viewed along the optical axis of the exposure apparatus. A wafer having a photoresist layer thereon is mounted in the exposure apparatus.

A first pattern, corresponding to that of the second opaque pattern of the photomask, is formed on the wafer by exposing the photoresist layer of the wafer through the photomask. An aberration on the plane of the pupil of the optical lens is estimated based on the relative location of the first pattern formed on the wafer.

To this end, the method of measuring the aberration of the lens may further include forming a second pattern on the wafer by exposing the photoresist layer to a third opaque pattern having a different form from that of the second opaque pattern. In this case, the third opaque layer may be part of the photomask having the second opaque pattern, as described above, or could be part of a separate photomask. The second pattern may be formed on the wafer by exposing the photoresist layer with the light that is passed through the entire plane of the pupil of the optical lens. In this case, if a separate photomask is not used, the first opaque pattern is removed from a region of the first surface of the substrate corresponding to the plane of the pupil of the lens An aberration of the optical lens maybe estimated by calculating an X-axis shift $f'_x(x,y)$ of the first pattern on the wafer relative to the location of the second pattern as a reference, and calculating a Y-axis shift $f'_y(x,y)$ of the first pattern on the wafer also relative to the second pattern as a reference. Together, the aberration of the pupil of the optical lens can be characterized in the form of a function $f(x,y)$ derived from the X-axis deviations $f'_x(x,y)$ and Y-axis deviations $f'_y(x,y)$ of the first pattern form the reference pattern.

BRIEF DESCRIPTION OF THE DRAWINGS

The above and other objects, features and advantages of the present invention will become more apparent from the following detailed description of the preferred embodiments thereof made with reference to the attached drawings, of which.

DETAILED DESCRIPTION OF THE PREFERRED EMBODIMENTS

Figure 1:
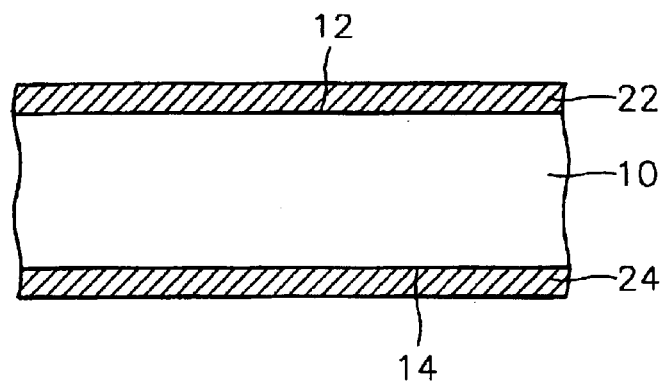
FIGS. 1 through 3 illustrating a method of manufacturing a photomask for measuring lens aberration according to the present invention.

The preferred embodiments of the present invention now will be described more fully with reference to the accompanying drawings. In the drawings, the thickness of layers and regions are exaggerated for clarity. Also, when a layer is referred to as being "on" another layer or substrate, such a description refers to the fact the layer in question can be disposed directly on the other layer or substrate, or intervening layers may be present therebetween.

Figure 2:
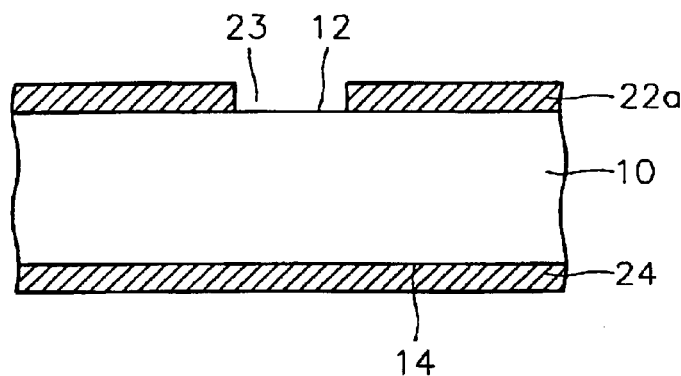
Figure 3:
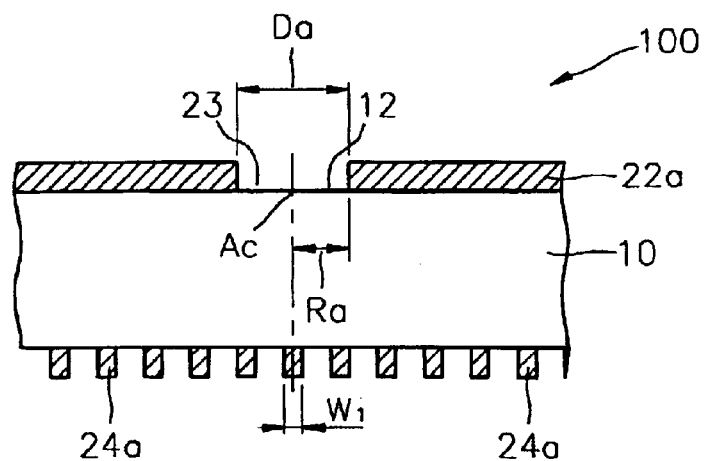

FIGS. 1–3 illustrate the manufacturing of a photomask 100 according to the present invention. Referring now to FIG. 1, reference numeral 10 designates a transparent substrate of the photomask 100. The substrate 10 is made of quartz. A first opaque layer 22 and a second opaque layer 24 are respectively formed on a first surface 12 of the transparent substrate 10 and a second surface 14, which is opposite to the first surface 12. Preferably, the first and second opaque layers 22 and 24 are formed of chromium.

Figure 4:
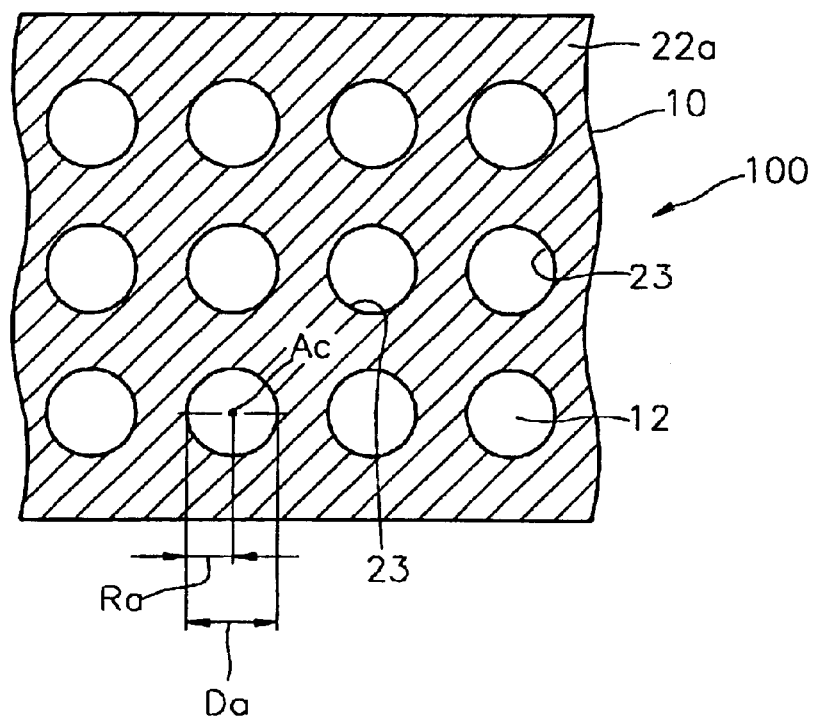
FIG. 4 is a plan view of a photomask for measuring lens aberration according to the present invention.

Referring to FIG. 2, the first opaque layer 22 is patterned to form a first opaque pattern 22a having a plurality of apertures 23 exposing the first surface 12 of the transparent substrate 10. FIG. 4 is a plan view of the photomask 100 according to the present invention. The apertures 23 defined by the first opaque pattern 22a each have a diameter Da of about 10 to 30 μm. Preferably, the apertures 23 each have a diameter Da of about 20 μm.

Figure 5:
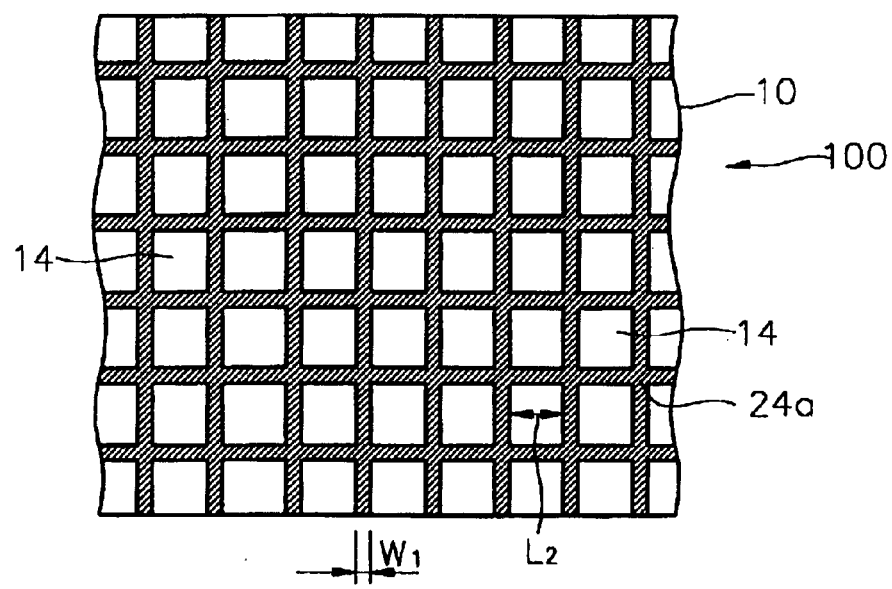
FIG. 5 is a bottom view of the photomask for measuring lens aberration according to the present invention.

Referring to FIG. 3, the second opaque layer 24 is patterned to form a second opaque pattern 24a on the second surface 14 of the transparent substrate 10. FIG. 5 is a bottom view of the photomask 100 according to the present invention. As shown in FIG. 5, the second opaque pattern 24a is a grid defining a plurality of rectangular openings that expose the second surface 14 of the substrate 10. The line width $W_1$ of the grid of the second opaque pattern 24a is about 1 to 3 μm. Preferably, the grid of the second opaque pattern 24a has a width $W_1$ of about 2 μm. Also, the apertures 23 of the first opaque pattern 22a have a diameter that is preferably 5 to 15 times greater than the line width $W_1$ of the second opaque pattern 24a.

In addition, the first and second opaque patterns 22a and 24a are aligned such that respective portions of the opaque layer constituting the second opaque pattern 24a are correspondingly aligned with the apertures 23. Specifically, a respective portion of the opaque layer constituting the second opaque pattern 24a is laterally offset relative to the center Ac of each aperture 23 (i.e., in the radial direction of the apertures 23) by a predetermined distance that is smaller than the radius Ra of the apertures. In order to manufacture the photomask with the first and second opaque patterns 22a and 24a aligned in this way, alignment marks may be formed on the first and/or second surface 12 or 14 of the transparent substrate 10.

Figure 6:
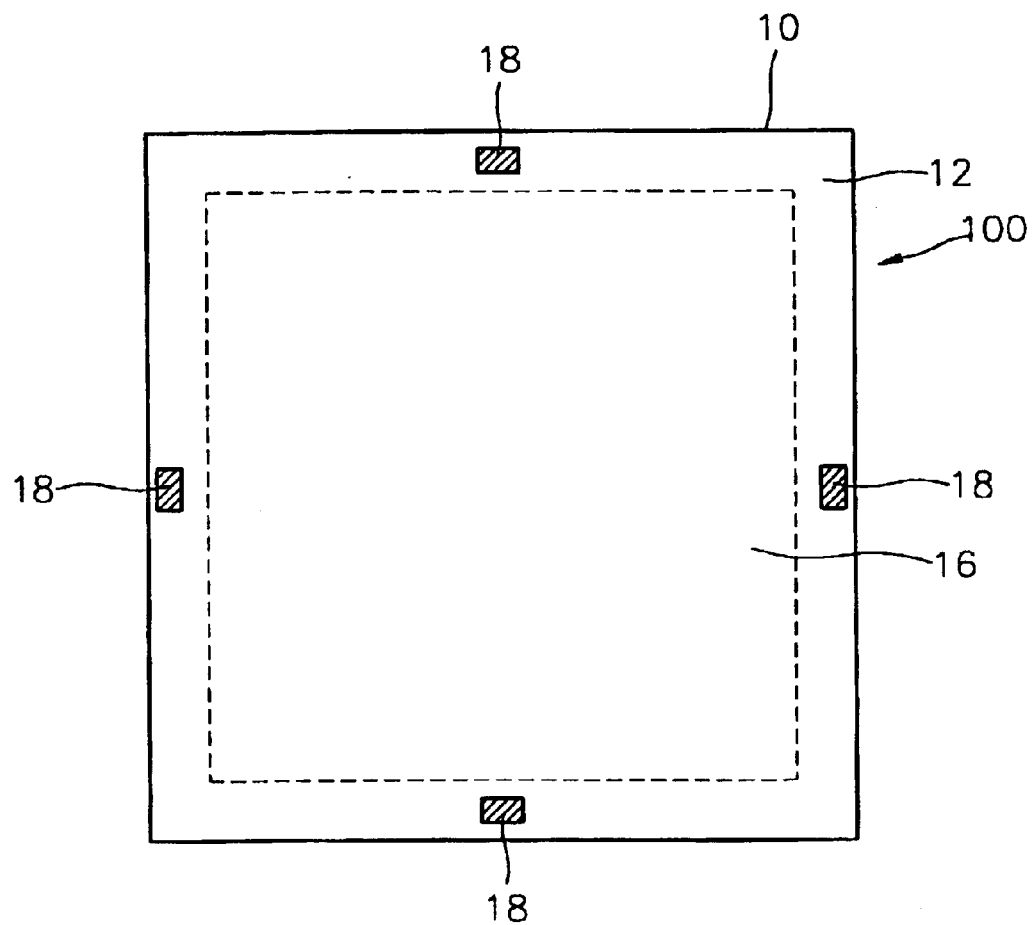
FIG. 6 is a top view of an embodiment of a photomask, having alignment keys, for measuring lens aberration according to the present invention.

FIG. 6 shows such alignment marks 18 as formed at the peripheral of a patterned region 16 whereat the first opaque pattern 22a is formed. In this case, the alignment marks 18 can be formed along with the patterning the first opaque layer 22 to form the first opaque pattern 22a. When the alignment marks 18 are formed on the first surface 12 along with the first opaque pattern 22a, the second opaque layer 24 is patterned by a process aligned with the substrate 10 using the align marks 18 to thereby form the second opaque pattern 24a in alignment with the first opaque pattern 22a.

Figure 7:
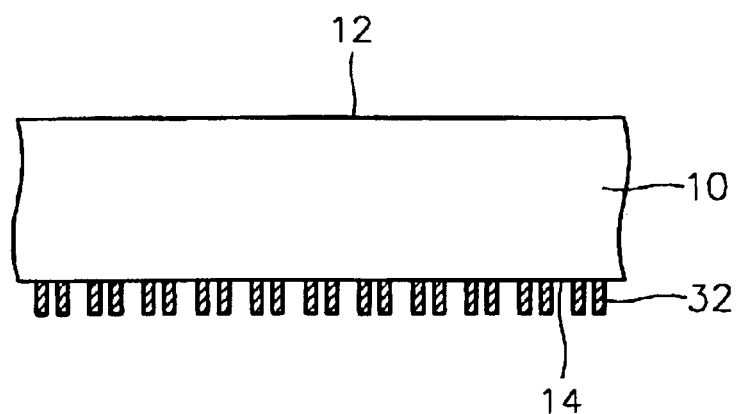
FIG. 7 is a sectional view of an embodiment of a photomask, having a third opaque pattern, for measuring lens aberration according to the present invention.

Also, when the second opaque pattern 24a is formed, a third opaque pattern 32 may be formed in a region of the second surface 14 of the transparent substrate 10 not occupied by the second opaque pattern 24a, as shown in FIG. 7. The third opaque pattern 32 is to be used as a reference in calculating the amount by which an image pattern, formed on a substrate using the second opaque pattern 24a, is shifted from an ideal reference frame. This relative shift in the image pattern is used to measure the lens aberration, as will be described in more detail later on.

When the third opaque pattern 32 is formed on the transparent substrate 10 as shown in FIG. 7, the first surface 12 has to be free from the first opaque layer 22 at a region thereof corresponding (aligned) with the region occupied by the third opaque pattern 32. In other words, the first surface 12 opposite to the region occupied by the third opaque pattern 32 must be exposed. In this case, the first surface 12 of the transparent substrate 10 will include a pattern region 16 occupied by the first opaque pattern 22a and a transmissive region overlying the third opaque pattern 32 on the second surface 14. Furthermore, although the third opaque pattern 32 has been described as being formed on the photomask 100, the third opaque pattern 32 can be provided on a separate photomask that is used in combination with the photomask 100 to measure the lens aberration.

Figure 8:
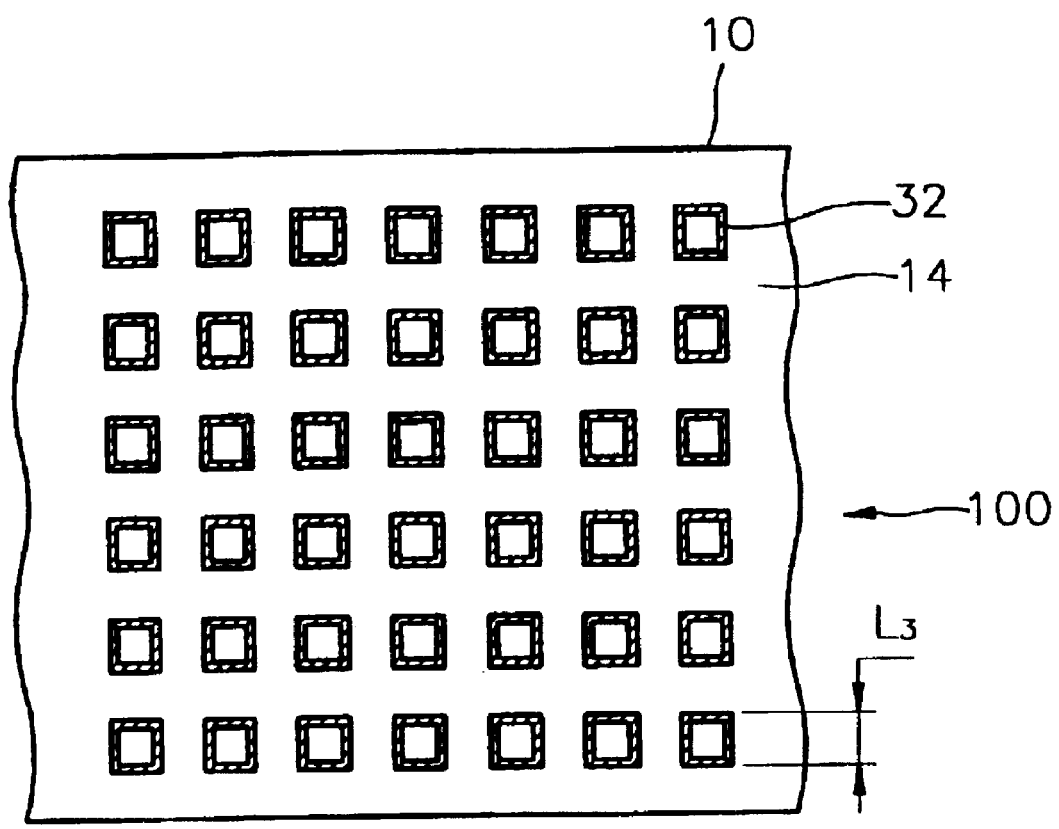
FIG. 8 is a plan view of a portion of a photomask for measuring lens aberration, which includes a third opaque pattern, according to the present invention.

FIG. 8 illustrates the second surface 14 of a photomask 100 having the third opaque pattern 32. As shown in FIG. 8, the third opaque pattern 32 is constituted by a two-dimensional array of rectangular opaque patterns. The length $L_3$ of a side of a rectangular pattern of the third opaque pattern 32 is smaller than the length $L_2$ (refer to FIG. 5) of a side of the rectangular opening defined by the grid of the second opaque pattern 24a.

Figure 9:
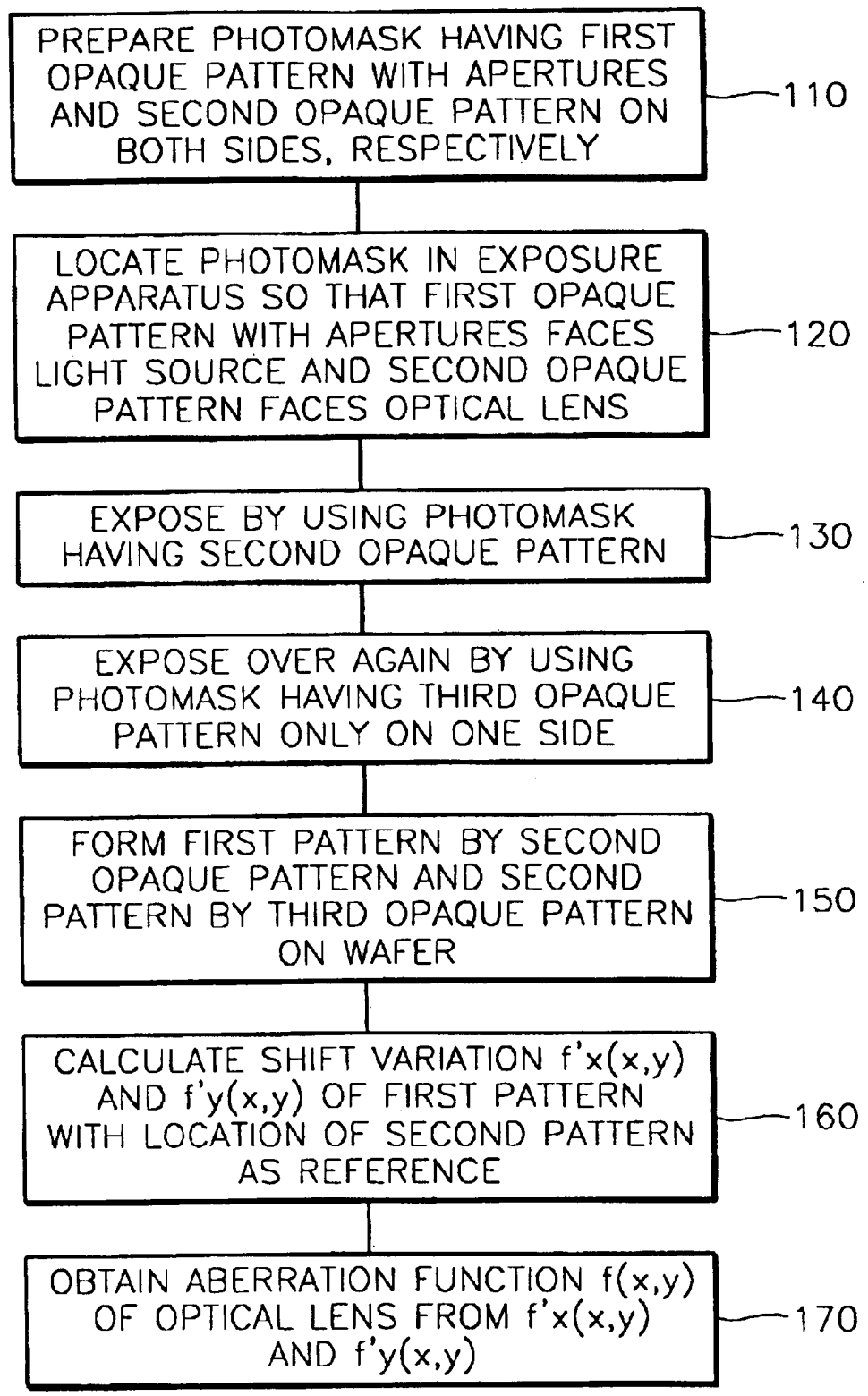
FIG. 9 is a flowchart of a method of measuring lens aberration according to the present invention.
Figure 10:
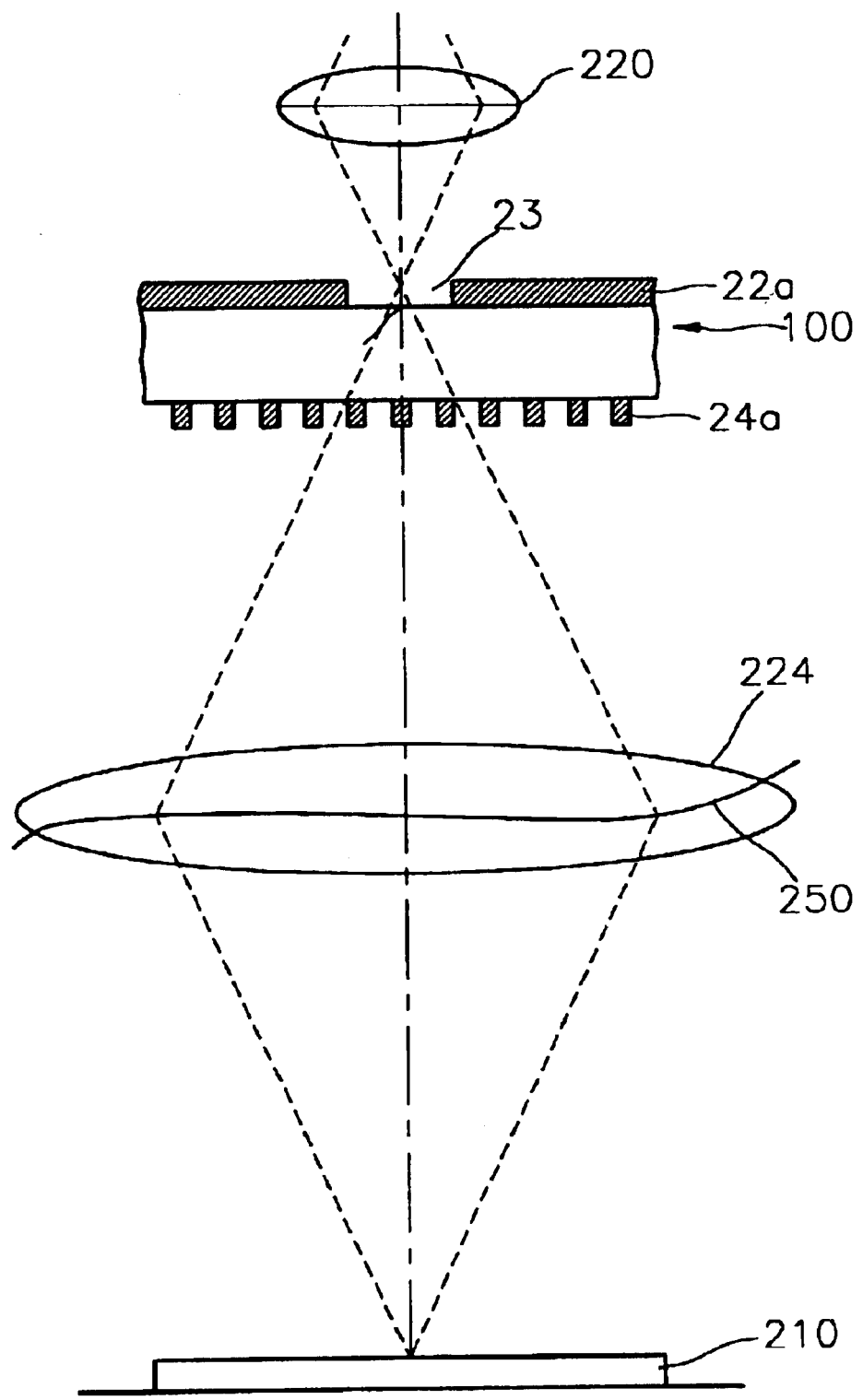
FIG. 10 is a schematic diagram of a portion of an exposure apparatus having a lens, and illustrating the transferring of a pattern of a photomask onto a wafer in measuring the aberration of the lens according to the present invention.

A method of measuring the aberration of a lens of an exposure apparatus will now be described with reference to FIGS. 9 and 10.

First, a photomask 100 having the structure described with reference to FIGS. 1 through 8 is prepared (step 110).

The photomask 100 is placed in an exposure apparatus so that the first opaque pattern 22a of the photomask 100 faces a light source 220 of an optical system of the exposure apparatus, and the second opaque pattern 24a faces the optical lens whose aberration is to be measured (step 120).

Next, a photoresist layer on a wafer 210 is exposed by directing light from the light source 220 onto the photoresist layer through the photomask 100 (step 130). Consequently, an image corresponding to the second opaque pattern 24a of the photomask 100 is formed on the photoresist layer of the wafer 210 by incident light that has passed through the apertures 23 defined by the first opaque pattern 22a.

Figure 11:
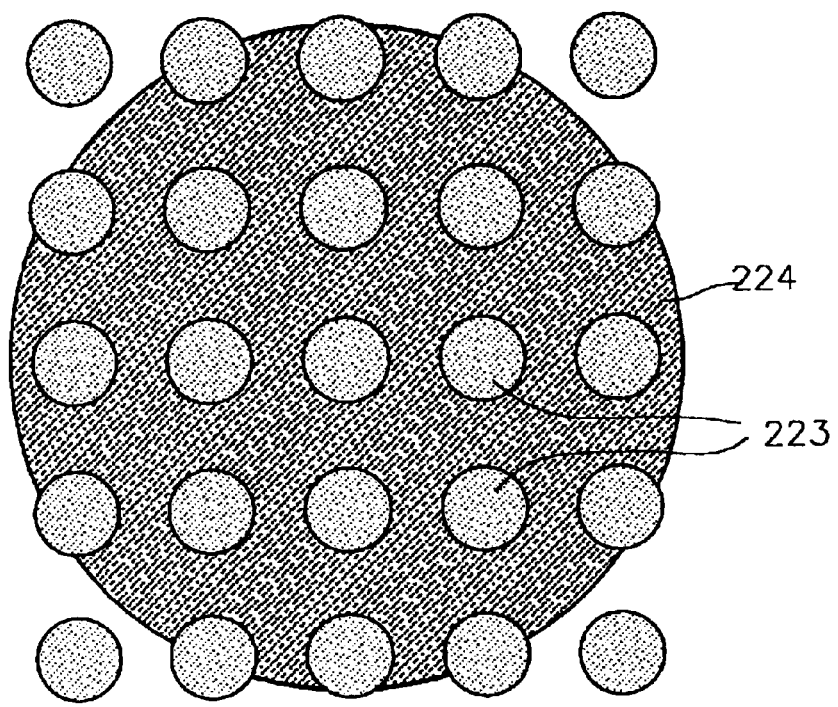
FIG. 11 is a diagram illustrating locations of a beam passed through apertures formed by a first opaque pattern of a photomask, as projected onto the plane of a pupil of an optical lens according to the present invention.

FIG. 11 illustrates the specific locations 223 on the pupil plane 224 of the optical lens, through which light has passed after propagating through the apertures 23 defined by the first opaque pattern 22a of the photomask 100. As described above, the effects of the aberration of images formed by light passing only through specific locations on the plane 224 of the pupil of the optical lens can be used to glean information useful in characterizing the aberration of the optical lens.

The photoresist layer on the wafer 210 is exposed again using exposure light directed through a photomask comprising a third opaque pattern 32 (FIG. 8) having a shape different from the second opaque pattern 24a (step 140). The image formed on the photoresist layer by light passing through the region of the photomask occupied by the third opaque pattern 32 is used as a reference in measuring the aberration produced by the pupil of the optical lens. As mentioned above, a separate mask on which a third opaque pattern 32 is formed may be used to produce the reference image on the wafer. Thus, it is possible to perform the exposure process of step 140 before the exposure process of step 130 according to the present invention.

In the case in which the photomask 100 having the second opaque layer 24a is used for the exposure process of step 140, as well, the first opaque layer 22 is completely removed from the first surface 12 of the transparent substrate 10, which corresponds to the region having the third opaque pattern 32. That is, the first surface 12 is exposed at a location opposite to the surface occupied by the third opaque pattern 32. As a result, in step 140, light from the light source 220 passes through the region of the substrate occupied by the third opaque pattern 32 and through the plane 224 of the entire pupil of the optical lens to expose the photoresist layer on the wafer 210.

Figure 12:
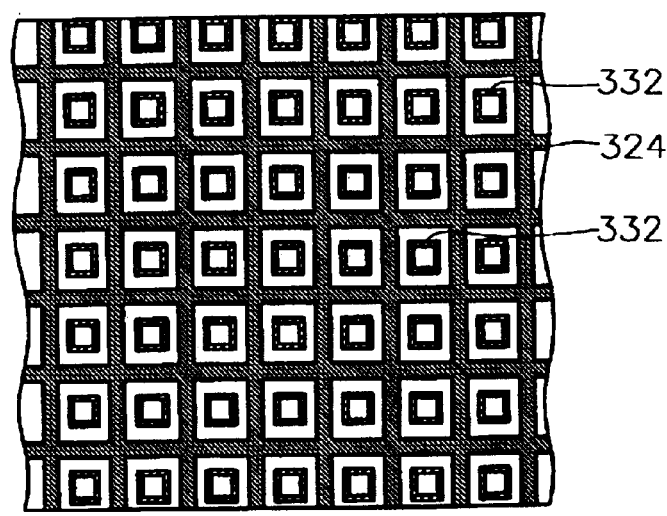
FIG. 12 illustrates a first pattern and a second pattern formed on a wafer to measure lens aberration according to the present invention.

After the exposure processes have been performed, the photoresist layer on the wafer 210 is developed (step 150) to form a first pattern 324 and a second pattern 332 on the wafer 210, as shown in FIG. 12. Hence, the first pattern 324 corresponds to the second opaque pattern 24a and the second pattern 332 corresponds to the third opaque pattern 32.

Thereafter, the aberration produced by the pupil of the optical lens is evaluated based on the relative location at which the first pattern 324 is formed on the wafer 210. To this end, the location of the first pattern 324 is measured in an X-axis direction and a Y-axis direction (orthogonal directions), and an X-axis shift $f_x(x,y)$ and a Y-axis shift $f_y(x,y)$ of the first pattern 324 on the wafer 210 is calculated by using the location of the second pattern 332 as a reference. Consequently, the amount by which the first pattern 324 is shifted relative to its ideal location is calculated (step 160).

Finally, an aberration function 250 $f(x,y)$ of the optical lens, in the plane 224 of the pupil thereof, is calculated based on the values of the X-axis shift $f_x(x,y)$ and Y-axis shift $f_y(x,y)$ of the first pattern 324 (step 170).

A photomask for measuring lens aberration according to the present invention has first and second opaque patterns on opposite surfaces of a transparent substrate. The first opaque pattern defines a plurality of apertures, and the second opaque pattern has a predetermined shape for forming a corresponding image on a substrate. The apertures ensure that the light proceed through only specific regions of the plane of the pupil of the lens. Accordingly, the present invention does away with the need to align a photomask with apertures when precisely measuring the aberration of a lens. Hence, the present invention saves time in and enhances the reliability of the method of measuring the aberration of the lens Finally, although the present invention has been described above in connection with the preferred embodiments thereof, the invention may, however, be embodied in many different forms and should not be construed as being limited to the preferred embodiments. Rather, variations and modifications of the preferred embodiments can be practiced by those skilled in the art within the true spirit and scope of the present invention as defined by the appended claims.

What is claimed is:

1. A photomask for use in measuring the aberration of an optical lens, the photomask comprising:

a transparent substrate having a first surface and a second surface on respectively opposite sides of the transparent substrate;

a first opaque pattern on the first surface of the transparent substrate, and defining a plurality of apertures that expose the first surface of said transparent substrate, wherein said apertures limit the amount of exposure light that can pass through the photomask via said transparent substrate; and a second opaque pattern on the second surface of the transparent substrate, portions of opaque material of said second opaque pattern being aligned with said apertures, respectively, whereby exposure light passing through said apertures will form an image corresponding to that of said second opaque pattern.

2. The photomask of claim 1, wherein the first opaque pattern and the second opaque pattern are of chromium.

3. The photomask of claim 1, wherein the apertures defined by the first opaque pattern have the same diameter.

4. The photomask of claim 3, wherein the diameter is 10 to 30 µm.

5. The photomask of claim 3, wherein the second opaque pattern comprises a plurality of lines of opaque material, and the diameter of the apertures defined by the first opaque pattern is 5 to 15 times larger than the width of the lines of the opaque material constituting the second opaque pattern.

6. The photomask of claim 3, wherein the second opaque pattern comprises a plurality of lines of opaque material each having a width of 1 to 3 µm.

7. The photomask of claim 1, wherein the second opaque pattern is a grid of opaque material.

8. The photomask of claim 7, wherein the apertures defined by the first opaque pattern are circular, such that a portion of the opaque material constituting the grid is aligned within a predetermined distance from the center of a respective one of each of said apertures, said distance being smaller than the radius of the aperture.

9. The photomask of claim 1, and further including alignment marks on at least one of the first surface and the second surface of the transparent substrate.

10. The photomask of claim 1, and further comprising a third opaque pattern on the second surface of the transparent substrate and aligned with a transmissive region of said first surface of the substrate, the pattern of said third opaque pattern being different from that of said second opaque pattern, whereby an image formed by light passing through said photomask via said transmissive region can be used as a reference to determine the relative location of the image corresponding to that of said second opaque pattern.

11. The photomask of claim 10, wherein the third opaque pattern is constituted by an array of rectangular portions of opaque material.

12. The photomask of claim 10, wherein the first surface of the transparent substrate has a pattern region occupied by said first opaque pattern, and the transmissive region is free of said first opaque pattern.

13. In combination with an exposure apparatus having a light source, and an optical lens, a photomask for use in measuring the aberration of the optical lens, said photomask comprising:

a transparent substrate having a first surface facing towards said light source of the exposure apparatus along the optical axis of the exposure apparatus, and a second surface facing towards the optical lens along the optical axis of the exposure apparatus, wherein the first surface and the second surface are respectively on opposite sides of the transparent substrate;

a first opaque pattern on the first surface of the transparent substrate, and defining at least one aperture that exposes the first surface of said transparent substrate and thereby delimits a region of the photomask through which light from the light source can pass such that only a predetermined portion of light from the light source can pass through said photomask to the optical lens; and a second opaque pattern on the second surface of the transparent substrate, portions of opaque material of said second opaque pattern being aligned with said apertures, respectively, whereby light passing through said apertures will form images corresponding to that of said second opaque pattern.

14. The combination of claim 13, wherein the first opaque pattern defines a plurality of said apertures.

15. The combination of claim 13, wherein the first opaque pattern and the second opaque pattern of the photomask are of chromium.

16. The combination of claim 13, wherein the diameter of each said at least one aperture defined by the first opaque pattern of the photomask 10 to 30 µm.

17. The combination of claim 13, wherein the second opaque pattern of the photomask is a grid of opaque material defining a plurality of rectangular openings that expose the second surface of said substrate.

18. The combination of claim 17, wherein lines of the opaque material forming the grid pattern each have a width of 1 to 3 µm.

19. The combination of claim 17, wherein each said at least one aperture defined by the first opaque pattern is circular, such that a portion of the opaque material constituting the grid of said second opaque pattern is aligned within a predetermined distance from the center of a respective one of each said at least one aperture, said distance being smaller than the radius of the aperture.

20. The combination of claim 13, wherein the photomask further includes alignment marks on at least one of the first surface and the second surface of the transparent substrate.

21. The combination of claim 13, wherein the photomask further includes a third opaque pattern on the second surface of the transparent substrate, said third opaque pattern being aligned with a transmissive region of said first surface of the substrate, and the pattern of said third opaque pattern being different from that of said second opaque pattern, whereby an image formed by light passing through said photomask via said transmissive region can be used as a reference to determine the relative location of the image corresponding to that of said second opaque pattern.

22. The combination of claim 21, wherein the third opaque pattern is constituted by an array of rectangular portions of opaque material.

23. The combination of claim 21, wherein the first surface of the transparent substrate has a pattern region occupied by said first opaque pattern, and the transmissive region is free of the opaque pattern.

24. A method of manufacturing a photomask for measuring the aberration of an optical lens, said method comprising:

forming a first layer of opaque material and a second layer of opaque material on a first surface of a transparent substrate and a second surface opposite to the first surface, respectively;

patterning the first layer to form a first opaque pattern having a plurality of apertures that expose the first surface, wherein said apertures limit the amount of exposure light that can pass through the photomask via said transparent substrate; and patterning the second opaque layer to form a second opaque pattern on the second surface, portions of the opaque material of said second opaque pattern being aligned with said apertures, respectively, whereby exposure light passing through said apertures will form an image corresponding to that of said second opaque pattern.

25. The method of claim 24, wherein said forming the first and second layers of opaque material comprises forming first and second layers of chromium on the first and second surfaces of the substrate, respectively.

26. The method of claim 24, wherein said patterning of the first opaque layer forms apertures therethrough each having a diameter of 10 to 30 µm.

27. The method of claim 24, wherein said patterning of the second opaque layer forms a grid of opaque material defining a plurality of rectangular openings that expose the second surface of the transparent substrate.

28. The method of claim 27, wherein the grid has a line width of 1 to 3 µm.

29. The method of claim 24, wherein said patterning the first opaque layer includes forming alignment marks on the first surface of the substrate.

30. The method of claim 29, wherein said patterning the second opaque layer comprises aligning the second opaque pattern with the apertures defined by the first opaque pattern, using said alignment marks.

31. The method of claim 30, wherein said patterning the first opaque layer comprises forming circular apertures therethrough, and said patterning the second opaque layer forms a grid of opaque material defining a plurality of rectangular openings that expose the second surface of the substrate, and aligning portions of the opaque material constituting the grid with the apertures using said alignment marks.

32. The method of claim 31, wherein the grid has a line width of 1 to 3 µm.

33. The method of claim 24, wherein said patterning the first opaque layer includes forming a transmissive region that is free of said first opaque pattern and at which the first surface of the transparent substrate is exposed, and said pattering the second opaque layer includes forming a third opaque pattern different from the second opaque pattern on a region of the second surface corresponding to the transmissive region of the first surface.

34. The method of claim 33, wherein the second opaque pattern is a grid of opaque material defining a plurality of rectangular openings that expose the second surface of the transparent substrate, and the third opaque pattern is an array of rectangular portions of the second opaque layer.

35. The method of claim 34, wherein the length of one side of the rectangular portions of opaque material constituting the third opaque pattern is smaller than the length of a corresponding side of the rectangular openings defined by the grid.

36. A method of measuring the aberration of an optical lens, said method comprising:

providing a photomask including a transparent substrate having a first surface and a second surface on opposite sides from each other, a first opaque pattern on the first surface and defining a plurality of apertures that expose the first surface, and a second opaque pattern on the second surface and opaque portions of which are aligned with said apertures, respectively;

positioning the photomask in an exposure apparatus so that the first opaque pattern of the photomask faces a light source of the exposure apparatus along the optical axis of the exposure apparatus, and the second opaque pattern of the photomask faces the optical lens along the optical axis of the exposure apparatus, with the apertures aligned along the optical axis of the exposure apparatus with the plane of the pupil of the optical lens;

mounting a wafer having a photoresist layer thereon in the exposure apparatus;

forming a first pattern on the wafer by exposing the photoresist layer to light form the light source passed through the photomask such that the light passes through the apertures of the first opaque pattern and forms an image on the photoresist layer corresponding to the second opaque pattern; and determining the location of the first pattern formed on the wafer, relative to a reference position, and estimating an aberration of the optical lens based on the location of the first pattern formed on the wafer.

37. The method of claim 36, wherein said determining comprises forming a second pattern on the wafer by exposing the photoresist layer to light passed through a photomask having a third opaque pattern different from that of the second opaque pattern such that the light forms an image on the photoresist layer corresponding to said third opaque pattern, said second pattern on the wafer constituting said reference position.

38. The method of claim 37, wherein said forming the second pattern on the wafer comprises exposing the photoresist layer to light from the light source passed through the entire plane of the pupil of the optical lens.

39. The method of claim 37, wherein the exposing of the photoresist layer to form the second pattern on the wafer is performed before the photoresist layer is exposed to form the first pattern on the wafer.

40. The method of claim 37, wherein the exposing of the photoresist layer to form the second pattern on the wafer is performed after the photoresist layer is exposed to form the first pattern on the wafer.

41. The method of claim 37, wherein the estimating of the aberration of the optical lens comprises calculating an X-axis shift $f_x(x,y)$ of the first pattern on the wafer from the second pattern formed on the wafer as a reference, and calculating a Y-axis shift $f_y(x,y)$ of the first pattern on the wafer from the second pattern formed on the wafer as a reference.

* * * * *